(12) United States Patent
Song et al.

(10) Patent No.: US 8,601,404 B2
(45) Date of Patent: Dec. 3, 2013

(54) MODELING EUV LITHOGRAPHY SHADOWING EFFECT

(75) Inventors: Hua Song, San Jose, CA (US); James P. Shiely, Aloha, OR (US); Lena Zavyalova, Austin, TX (US)

(73) Assignee: Synopsys, Inc., Mountain View, CA (US)

( * ) Notice: Subject to any disclaimer, the term of this patent is extended or adjusted under 35 U.S.C. 154(b) by 2 days.

(21) Appl. No.: 13/363,258

(22) Filed: Jan. 31, 2012

(65) Prior Publication Data

US 2012/0240086 A1 Sep. 20, 2012

Related U.S. Application Data

(60) Provisional application No. 61/452,524, filed on Mar. 14, 2011.

(51) Int. Cl.
*G06F 17/50* (2006.01)

(52) U.S. Cl.
USPC ............... 716/51; 716/50; 716/52; 716/53

(58) Field of Classification Search
USPC .................................. 716/50–56
See application file for complete search history.

(56) References Cited

U.S. PATENT DOCUMENTS

| | | | | |
|---|---|---|---|---|
| 8,006,202 | B2* | 8/2011 | Lorusso et al. | 716/53 |
| 8,329,361 | B2* | 12/2012 | Hosoya | 430/5 |
| 2005/0214657 | A1* | 9/2005 | Mitsui | 430/5 |
| 2006/0129968 | A1* | 6/2006 | Pierrat | 716/21 |
| 2008/0102647 | A1 | 5/2008 | Chen | |
| 2008/0229273 | A1* | 9/2008 | Lorusso et al. | 716/19 |
| 2009/0097001 | A1* | 4/2009 | Trogisch et al. | 355/52 |
| 2009/0097004 | A1* | 4/2009 | Trogisch et al. | 355/67 |
| 2010/0167181 | A1* | 7/2010 | Kim | 430/5 |

OTHER PUBLICATIONS

Lorusso, G.F., et al., "Full chip correction of EUV design", Mar. 3, 2010. SPIE, pp. 1-10.*
Ng, Philip C. W., et al., "Fully model-based methodology for simultaneous correction of extreme ultraviolet mask shadowing and proximity effects", Mar. 7, 2011, SPIE. pp. 1-13.*
T. Schmoeller et al., "EUV pattern shift compensation strategies", 2008 SPIE Digital Library, Proc. of SPIE, vol. 6921.
Vicky Philipsen et al., "Systematic study of EUV mask-shadowing effects and compensation strategies", Litho IIAP-F-Confidential, Jul. 25, 2010, Doc No. 20100725_TR_ALP_CCI_EUVshadowing.
Peter Nikolsky et al., "Feasibility study of the approach to Flare, Shadowing, Optical and Process corrections for EUVL OPC", Photomask Technology 2009, Proc. of SPIE vol. 7488.
Hoyoung Kang et al., "EUV simulation extension study for mask shadowing effect and it correction", Emerging Lithographic Technologies XII, Proc. of SPIE vol. 6921, 692131, 2008.

* cited by examiner

*Primary Examiner* — Stacy Whitmore
(74) *Attorney, Agent, or Firm* — Park, Vaughan, Fleming & Dowler LLP; Laxman Sahasrabuddhe (57) ABSTRACT

Systems and techniques for modeling the EUV lithography shadowing effect are described. Some embodiments described herein provide a process model that includes an EUV lithography shadowing effect component. Polygon edges in a layout can be dissected into a set of segments. Next, the EUV lithography shadowing effect component can be used to bias each segment. The modified layout having the biased segments can then be used as input for other components in the process model.

19 Claims, 9 Drawing Sheets

MODELING EUV LITHOGRAPHY SHADOWING EFFECT

RELATED APPLICATION

This application claims priority to U.S. Provisional Application No. 61/452,524, entitled "Fast and Accurate EUV Lithography Shadowing Effect Calculation and Correction," by Hua Song and James P. Shiely, filed 14 Mar. 2011, the contents of which are herein incorporated by reference.

BACKGROUND

1. Technical Field

This disclosure relates to integrated circuit design and fabrication. More specifically, this disclosure relates to methods and apparatuses for efficiently and accurately computing extreme ultraviolet (EUV) lithography shadowing effect.

2. Related Art

Extreme ultraviolet (EUV) lithography is one of the leading technologies for 16 nm and smaller node device patterning. An important patterning issue in EUV lithography is the shadowing effect due to oblique illumination. This effect can cause CD errors up to a few nanometers. Therefore, this effect needs to be compensated during mask synthesis.

Inaccuracies in the process model negatively affect the efficacy of downstream applications. For example, inaccuracies in a process model can reduce the efficacy of resolution enhancement technologies (RETs). If the process model is computationally inefficient, it can increase the time-to-market for an integrated circuit, which can cost millions of dollars in lost revenue.

SUMMARY

Some embodiments described herein provide systems and techniques for modeling the EUV lithography shadowing effect. Specifically, some embodiments described herein provide a process model that includes an EUV lithography shadowing effect component.

In some embodiments described herein, polygon edges in a layout can be dissected into a set of segments. Next, the EUV lithography shadowing effect component can be used to bias each segment. The modified layout having the biased segments can then be used as input for other components in the process model.

In some embodiments described herein, an EUV lithography shadowing effect component can bias a segment as follows. First, location information of the segment in the layout can be received. Next, a bias direction and a bias distance can be calculated based on an EUV lithography shadowing effect component and the location information of the segment. The segment can then be biased using the calculated bias distance and bias direction.

In some embodiments, the EUV lithography shadowing effect component can be determined by fitting parameters in the EUV lithography shadowing effect component to empirical data.

In some embodiments, the EUV lithography shadowing effect component includes a near side subcomponent and a far side subcomponent. Specifically, an EUV lithography shadowing effect subcomponent can be represented as $B = B_{max} \cdot \cos^n \alpha$, where B is the bias, $\alpha$ is an angle between a projection of an illumination ray on the mask plane and a normal of the segment, and $B_{max}$ and n are parameters that are fitted to empirical data.

In some embodiments, a process model that includes an EUV lithography shadowing effect component can be used to predict shapes that are expected to print on the wafer (e.g., by comparing the aerial image intensity value outputted by the process model with a threshold). In some embodiments, the process model that includes the EUV lithography shadowing effect component can be used in RETs, e.g., to correct a layout and/or add assist features in the layout.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Figure 1:
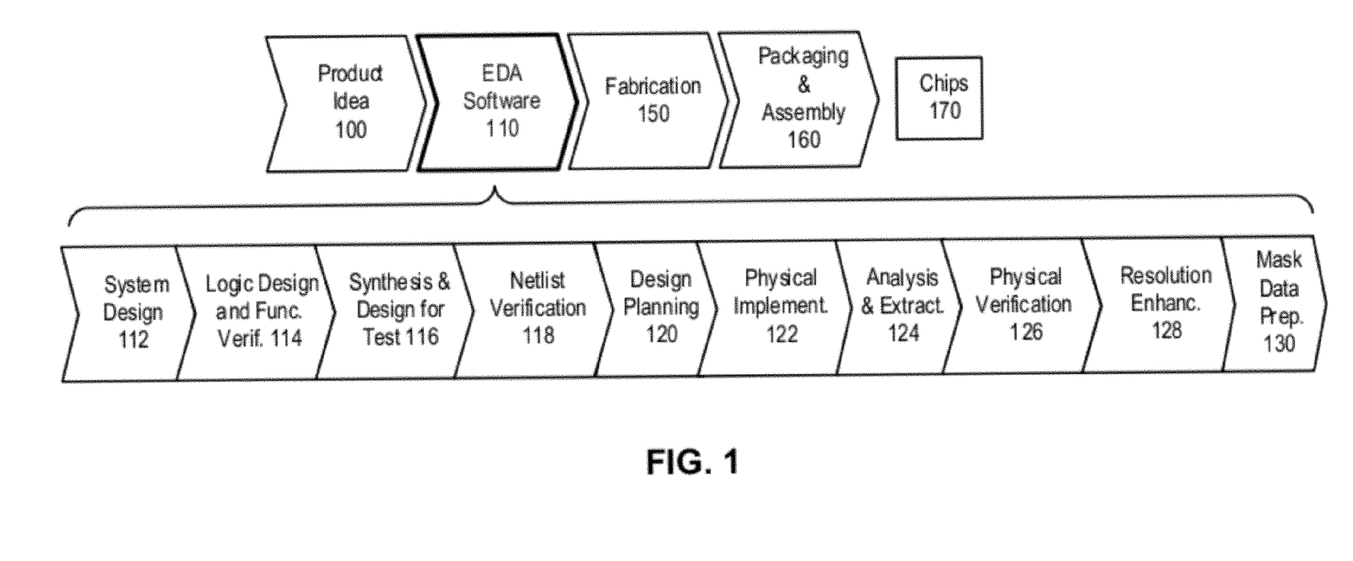
FIG. 1 illustrates various stages in the design and fabrication of an integrated circuit.

FIG. 1 illustrates various stages in the design and fabrication of an integrated circuit.

The process can start with a product idea (step 100) which can be realized using an integrated circuit that is designed using an EDA process (step 110). After the integrated circuit design is finalized, it can undergo a fabrication process (step 150) and a packaging and assembly process (step 160) to produce chips 170.

The EDA process (step 110) comprises steps 112-130, which are described below for illustrative purposes only and are not meant to limit the present invention. Specifically, the steps may be performed in a different sequence than the sequence described below.

During system design (step 112), circuit designers can describe the functionality that they want to implement. They can also perform what-if planning to refine functionality, check costs, etc. Hardware-software architecture partitioning can also occur at this stage.

During logic design and functional verification (step 114), the VHDL or Verilog code for modules in the system can be written and the design can be checked for functional accuracy, e.g., the design can be checked to ensure that it produces the correct outputs.

During synthesis and design for test (step 116), the VHDL/Verilog can be translated to a netlist. Further, the netlist can be optimized for the target technology, and tests can be designed and implemented to check the finished chips.

During netlist verification (step 118), the netlist can be checked for compliance with timing constraints and for correspondence with the VHDL/Verilog source code.

During design planning (step 120), an overall floorplan for the chip can be constructed and analyzed for timing and top-level routing.

During physical implementation (step 122), circuit elements can be positioned in the layout (placement) and can be electrically coupled (routing).

During analysis and extraction (step 124), the circuit's functionality can be verified at a transistor level and parasitics can be extracted.

During physical verification (step 126), the design can be checked to ensure correctness for manufacturing, electrical issues, lithographic issues, and circuitry.

During resolution enhancement (step 128), geometric manipulations can be performed on the layout to improve manufacturability of the design.

During mask data preparation (step 130), the design can be "taped-out" to produce masks which are used during fabrication.

Figure 2A:
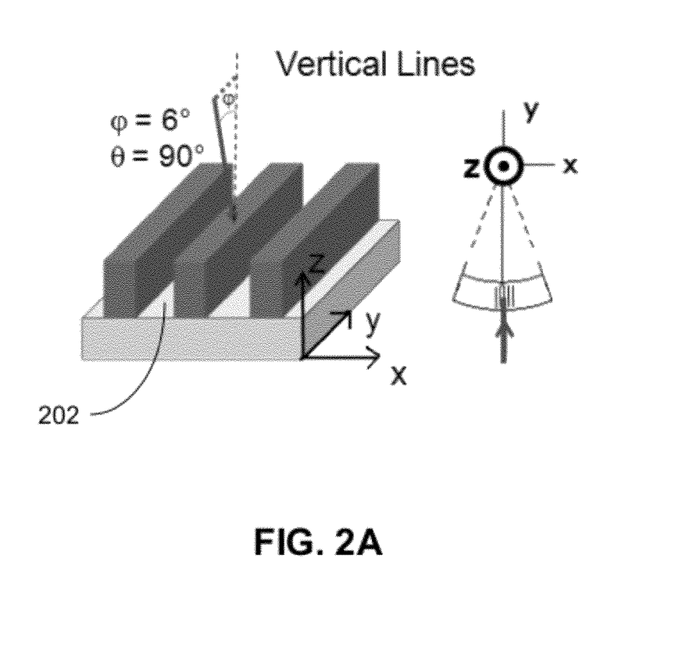
FIGS. 2A-2B illustrate why the shadowing effect can depend on the orientation of a line in an EUV lithography system in accordance with some embodiments described herein.
Figure 2B:
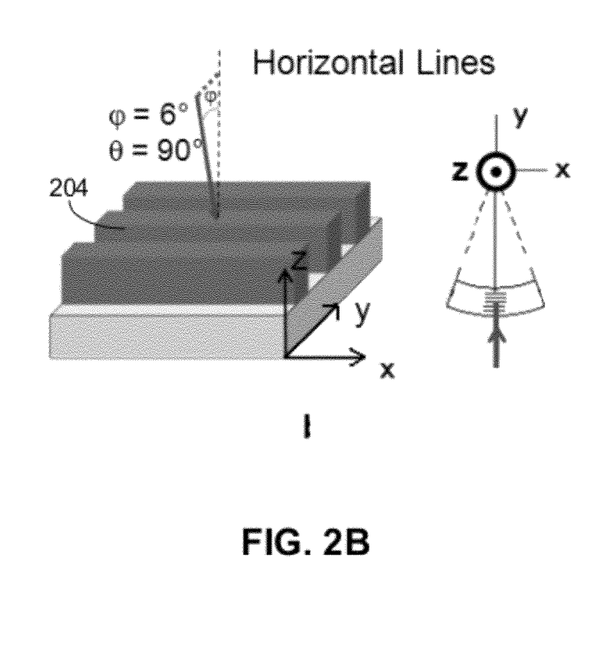

FIGS. 2A-2B illustrate why the shadowing effect can depend on the orientation of a line in an EUV lithography system in accordance with some embodiments described herein.

In EUV lithography, illumination is cast on the mask at an angle, e.g., 6° relative to the axis perpendicular to the mask plane. Due to this oblique illumination and absorber thickness on the EUV mask, shadows are formed around patterns represented by the absorber shapes that can make the absorber shapes to appear wider. This mask pattern widening due to the shadowing effect is passed on to the wafer image through the optical system and resist process, resulting in critical dimension (CD) errors up to a few nanometers in the printed patterns on the wafer.

FIG. 2A illustrates the illumination angle with respect to vertical lines, and FIG. 2B illustrates the illumination angle with respect to horizontal lines. As shown in the figures, the illumination angle is expected to cause no shadowing effect for line 202 in FIG. 2A. However, the illumination angle is expected to cause a non-negligible asymmetric shadowing effect for line 204 in FIG. 2B (i.e., the two horizontal edges of line 204 are expected to have different amounts of EUV lithography shadowing effect). The asymmetric shadowing effect can cause the two horizontal edges of line 204 to move by different amounts on the printed pattern.

Figure 3:
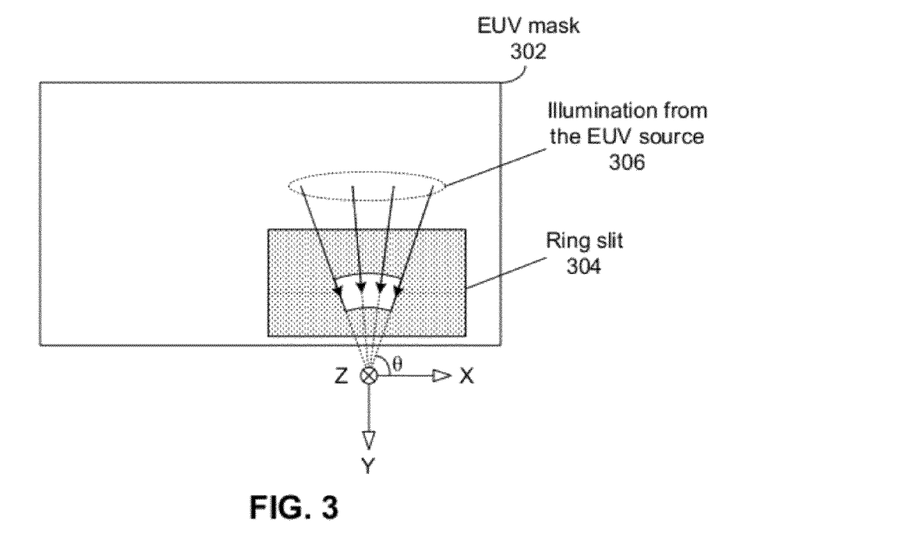
FIG. 3 illustrates how the incident angle can be uniquely determined by the location in the ring slit where the light passes in accordance with some embodiments described herein.

FIG. 3 illustrates how the incident angle can be uniquely determined by the location in the ring slit where the light passes in accordance with some embodiments described herein.

Ring slit 304 is positioned above EUV mask 302 so that EUV mask 302 only receives illumination from the EUV source 306 that passes through ring slit 304. The angle of the illumination for a given mask pattern depends on the location of the mask pattern with respect to ring slit 304.

In FIG. 3, the X-axis is directed toward the right of the drawing sheet, the Y-axis is directed toward the bottom of the drawing sheet, and the Z-axis is directed perpendicularly into the drawing sheet. The illumination from the EUV source is directed downward from above the drawing sheet into ring slit 304. The angle $\theta$ is the angle between the projection of an illumination ray on the XY plane (mask plane) and the X-axis. Note that angle $\theta$ corresponds to the location in ring slit 304 through which the illumination ray passes.

As shown in FIGS. 2A, 2B, and 3, the shadow distance (i.e., the amount of shadowing effect) depends on the pattern orientation as well as the incident angle of the EUV light. Since the incident angle can be uniquely determined by the location in the ring slit where the light passes, the shadow distance depends on the pattern orientation and the position of the pattern in the ring slit.

As with other systematic patterning errors, the EUV lithography shadowing effect needs to be accurately modeled and compensated in the EUV mask synthesis flow. Due to the complexity of mask topography and the multilayer substrate, shadowing effect calculation using rigorous lithography simulators is usually too slow to be used for full chip mask synthesis.

Techniques for fast shadowing effect computation were presented in two recent studies: (1) H. Kang, S. Hansen, J. van Schoot and K. van Ingen Schenau, "EUV simulation extension study for mask shadowing effect and its correction", Proc. SPIE, Vol. 6921, 69213I 2008; and (2) V. Philipsen and P. De Bisschop, "Simulation study of EUV shadowing effects", IMEC Program Technical Week, October 2009.

The so-called "cosine rule" technique presented in these studies is a computationally efficient, but it is inaccurate for calculating across-slit CD errors due to EUV lithography shadowing effects. Furthermore, since these studies present CD error formulas, they are inadequate for accurately modeling shadowing effect asymmetry and for accurately modeling shadowing effects on two dimensional (2D) features such as line ends, space ends, corners, etc.

The IMEC study used the following simple formula to model the shadowing effect: $B(\theta)=B_0^{HV}\cos^2(\omega+Ax)$, where $B_0^{HV}$ is the maximum mask bias at the slit center on horizontal line-and-space patterns, $\omega$ is the angle between pattern orientation and the scanning axis (i.e., the axis along which the scanner moves), and x is the position in the slit. The IMEC model has several shortcomings.

First, the IMEC model calculates the shadowing effects as a CD bias, i.e., the combined shadowing effect on the opposite edges of a line. In other words, the IMEC model assumes that the shadowing effect is symmetric. However, as explained above, and as verified using rigorous simulations, the shadowing effect is not symmetric.

Second, the IMEC model assumes the so called "$\cos^2$" rule. However, there is no theoretical justification for the exponent to be equal to 2. Indeed, experimental data has shown that the best exponent may be different from 2.

Third, the IMEC model is used to derive a set of rules, and then the set of rules is used to correct the mask to compensate for the shadowing effects. Specifically, the set of rules specify how much the edges need to be biased for each interval of the x value (i.e., the slit position). In other words, the IMEC model is designed to be used in rule-based correction, but not in simulation-model-based correction. Rule-based correction techniques have several disadvantages in comparison to simulation-model-based correction techniques. Specifically, rule-based techniques can result in discontinuity issues between intervals and are usually difficult to verify. Furthermore, it is impractical to handle complicated factors (e.g., two-dimensional features and density or pitch dependence) using rule-based techniques because the resulting rule table will be too complicated.

Some embodiments described in this disclosure address all of the shortcomings of the IMEC model. Specifically, embodiments described herein provide an EUV lithography shadowing effect component that (1) is more flexible and more accurate than the IMEC model, (2) provides bias calculations that are segment-based, and therefore are more suitable for correction and can accurately model asymmetric shadowing effects, and (3) can be used in simulation-model-based correction and simulation-model-based verification.

Figure 4:
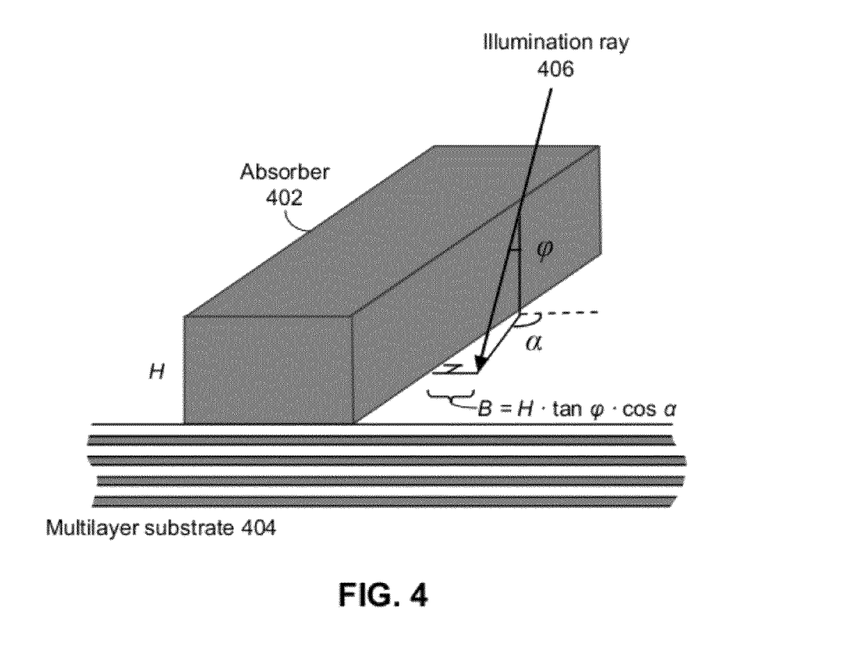
FIG. 4 illustrates how an expression for computing the shadowing effect can be derived in accordance with some embodiments described herein.

FIG. 4 illustrates how an expression for computing the shadowing effect can be derived in accordance with some embodiments described herein.

The portion of the EUV mask shown in FIG. 4 includes absorber 402 on multilayer substrate 404 (the multilayer substrate is reflective). Illumination ray 406 is incident on the EUV mask at an angle. The angle of illumination ray 406 with respect to the Z-axis is $\phi$, and with respect to the X-axis is $\alpha$. The shadowing effect corresponds to the value B, which can be computed using the following expression:

$$B = H \cdot \tan \phi \cdot \cos \alpha, \quad (1)$$

where H is the height of absorber 402. Note that, when a is zero, the incident ray is perpendicular to the pattern edge, and we get the maximum shadow width $B' = H \cdot \tan \phi$. Therefore, expression (1) can be rewritten as follows:

$$B = B' \cdot \cos \alpha. \quad (2)$$

The above expressions were derived under ideal conditions, e.g., under the assumption that the multilayer substrate 404 behaves like a single reflector. Secondary factors such as diffraction, multiple reflections from the multilayer substrate, reflections from the absorber, etc., need to be considered to model the shadowing effect accurately. Expression (2) can be modified to capture such secondary effects as follows:

$$B = B_{max} \cdot \cos^n \alpha, \quad (3)$$

where values of parameters $B_{max}$ and n can be determined by fitting the parameters to empirical data.

Note that expression (3) represents an edge placement error (EPE) due to shadowing at the pattern edge, hence $B_{max}$ is approximately half of the horizontal/vertical CD bias (HV bias) observed at the center of the slit.

Figure 5:
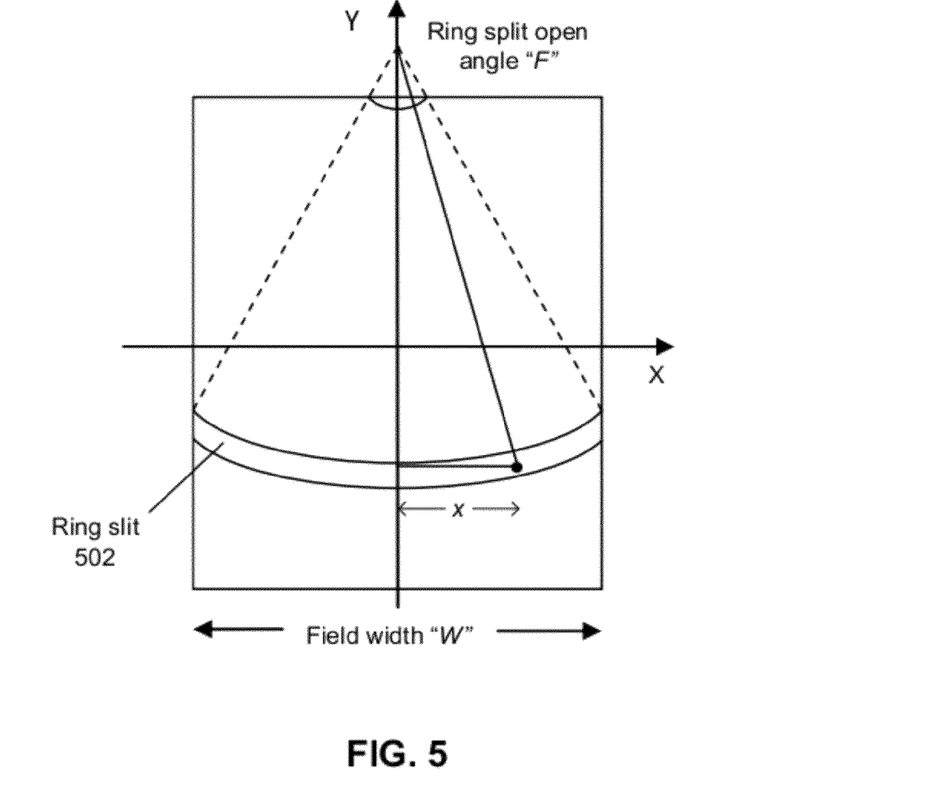
FIG. 5 illustrates a coordinate system that can be used to compute the shadowing effect in accordance with some embodiments described herein.

FIG. 5 illustrates a coordinate system that can be used to compute the shadowing effect in accordance with some embodiments described herein.

Let the exposure field width be "W" and the open angle of the ring slit be "F." A coordinate system can now be defined for the exposure field with the origin at the center of the field and the Y-axis pointing in the same direction as the concave side of the ring slit. The following expression for $\alpha$ can now be derived:

$$\alpha = \beta + \arcsin\left(\left(\frac{2}{W}\sin\frac{F}{2}\right)x\right) \quad (4)$$

$$\approx \beta + \left(\frac{2}{W}\sin\frac{F}{2}\right)x,$$

where, $\beta$ is the pattern edge's orientation angle and x is the X-coordinate of the evaluation point in the exposure field's coordinate system.

Once the value of $\alpha$ is computed, it can be used in expression (3) to compute the shadow effect. To model the asymmetric nature of the shadow effect, two separate expressions can be used, as shown below:

$$B_{near} = B_{max\_near} \cdot \cos^n \alpha, \quad (5)$$

$$B_{far} = B_{max\_far} \cdot \cos^n \alpha, \quad (6)$$

where $B_{max\_near}$, $B_{max\_far}$, and n can be determined by fitting the parameters to empirical data. Expressions (5) and (6) have the same exponent value n; however, in some embodiments, the exponent values can be different, i.e., the exponents in the near side and far side expressions can be fitted separately. The value of $\alpha$ can be used to determine whether the incident ray is incident on the near side or far side of a pattern.

Figure 6A:
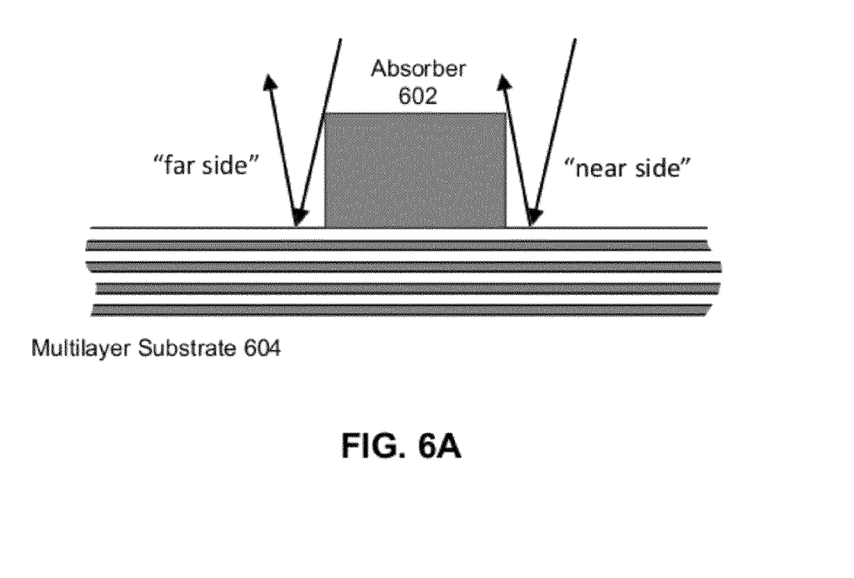
FIG. 6A illustrates the near side and the far side of a pattern in accordance with some embodiments described herein.

FIG. 6A illustrates the near side and the far side of a pattern in accordance with some embodiments described herein.

The illumination rays are incident on the mask at an angle and reflect off the multilayer substrate 604. The figure shows the near side and the far side of absorber 602.

Figure 6B:
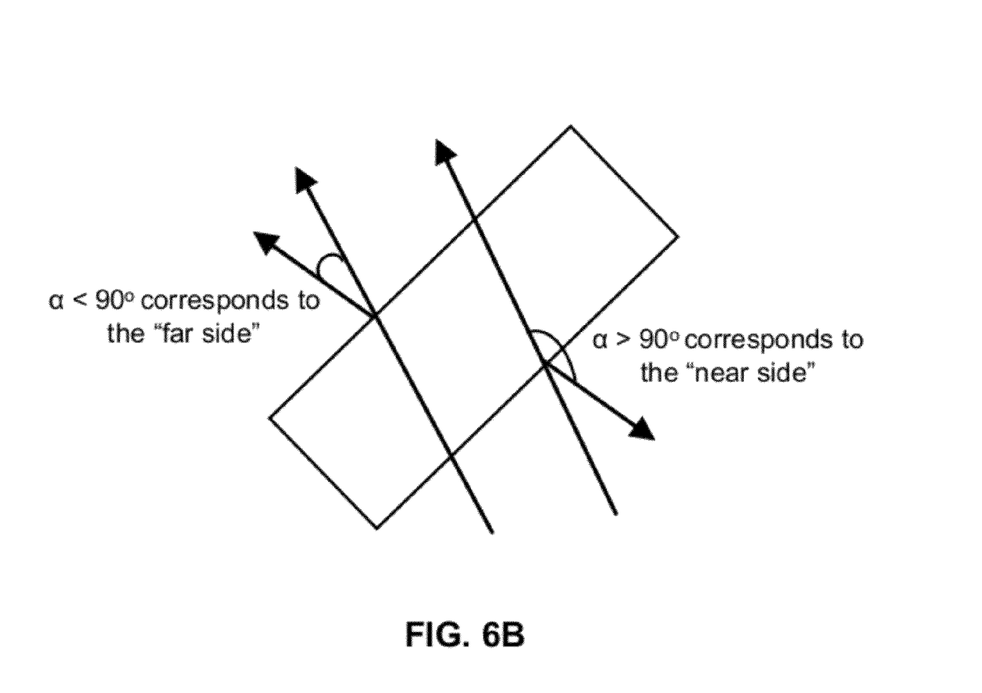
FIG. 6B illustrates how the value of angle $\alpha$ can be used to determine whether the incident ray is incident on the near side or far side of a pattern.

FIG. 6B illustrates how the value of angle $\alpha$ can be used to determine whether the incident ray is incident on the near side or far side of a pattern.

Note that value of angle $\alpha$ corresponds to the angle between the incident ray and a normal of an edge of a polygon. If the value of angle $\alpha$ is greater than 90°, then the edge is on the near side and expression (5) can be used to compute the edge bias due to the shadowing effect. On the other hand, if the value of angle $\alpha$ is less than 90°, then the edge is on the far side and expression (6) can be used to compute the edge bias due to the shadowing effect.

In some embodiments described herein, more than two expressions can be used. For example, the range of values for $\alpha$ can be partitioned into multiple sub-ranges (e.g., 0°-30°, 30°-60°, 60°-90°, etc.) and a separate subcomponent can be fitted for each of the sub-ranges.

Figure 6C:
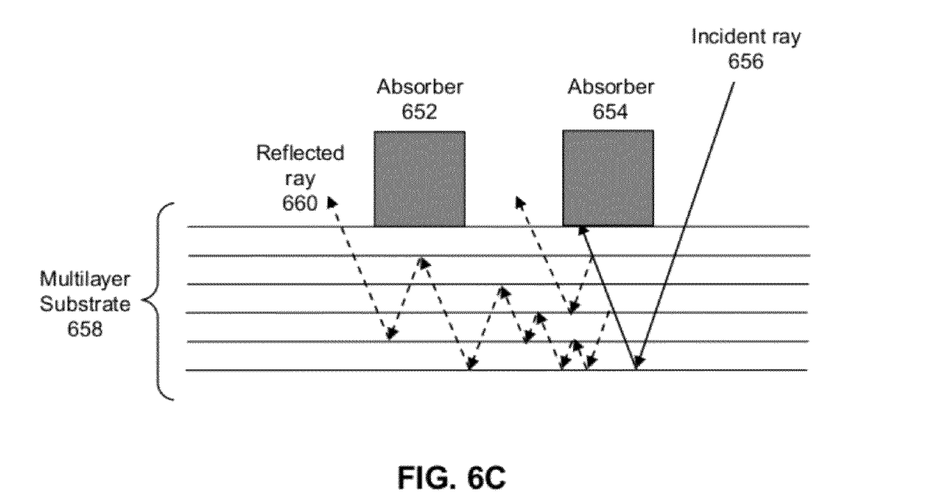
FIG. 6C illustrates how an incident ray may be reflected or diffracted multiple times in the multilayer substrate in accordance with some embodiments described herein.

FIG. 6C illustrates how an incident ray may be reflected or diffracted multiple times in the multilayer substrate in accordance with some embodiments described herein.

Incident ray 656 may be reflected and diffracted by multilayer substrate 658 multiple times and the resulting light ray may emerge into the resist layer at locations other than that predicted by a single reflection, usually much farther away from the entering point. For example, incident ray 656 is incident on multilayer substrate 658 to the right of absorber 654, but reflected ray 660 emerges to the left of a nearby absorber 652. Due to this phenomenon, the incoming light's influence is not limited to the immediately nearby edges, but extends to edges farther away, although the influence decreases as the distance increases. Line size (e.g., width of a line in a line-and-space pattern), space size (e.g., width of a space in a line-and-space pattern), pattern density, pitch (e.g., the sum of a line width and a space width in a line-and-space pattern), etc., are different factors that may contribute to this effect.

In some embodiments, the EUV lithography shadowing effect component includes modeling terms to capture effects of such multiple reflections and/or diffractions. Specifically, in some embodiments, one or more of the following expressions can be used to calculate the bias distance:

$$B_{near} = (B_{max\_near} + f_{near}(\text{density}, \text{visible area}, \text{blocked area})) \cdot \cos^n(\alpha) \quad (7)$$

$$B_{far} = (B_{max\_far} + f_{far}(\text{density}, \text{visible area}, \text{blocked area})) \cdot \cos^n(\alpha) \quad (8)$$

$$B_{near} = B_{max\_near} \cos^n(\alpha) + f_{near}(\text{density}, \text{visible area}, \text{blocked area}) \quad (9)$$

$$B_{far} = B_{max\_far} \cdot \cos^n(\alpha) + f_{far}(\text{density}, \text{visible area}, \text{blocked area}) \quad (10)$$

In the above expressions, $f_{near}$ and $f_{far}$ can be general modeling functions (e.g., polynomials) whose parameters are fitted during model calibration. The arguments of these functions can include: (1) a polygon density that is computed within a given ambit of the segment, (2) a visible area at a given point (e.g., the center) on the segment (the visible area can be defined as the area that is visible when looking out of the polygon), and/or (3) a blocked area at a given point (e.g., the center) in the layout (the blocked area can be defined as the area inside the polygon that is "visible" when looking into the polygon). The arguments of these functions were presented for illustration purposes only, and are not intended to limit the embodiments to the forms disclosed. Specifically, the functions $f_{near}$ and $f_{far}$ can have more or fewer arguments.

A process model models the behavior of one or more semiconductor manufacturing processes, and is typically determined by fitting parameters to empirical data that is obtained by measuring dimensions of printed shapes. A process model can have multiple components that may correspond to different parts and/or effects in the semiconductor manufacturing process flow. Some embodiments described herein feature a process model for modeling EUV lithography that includes an EUV lithography shadowing effect component.

Figure 7:
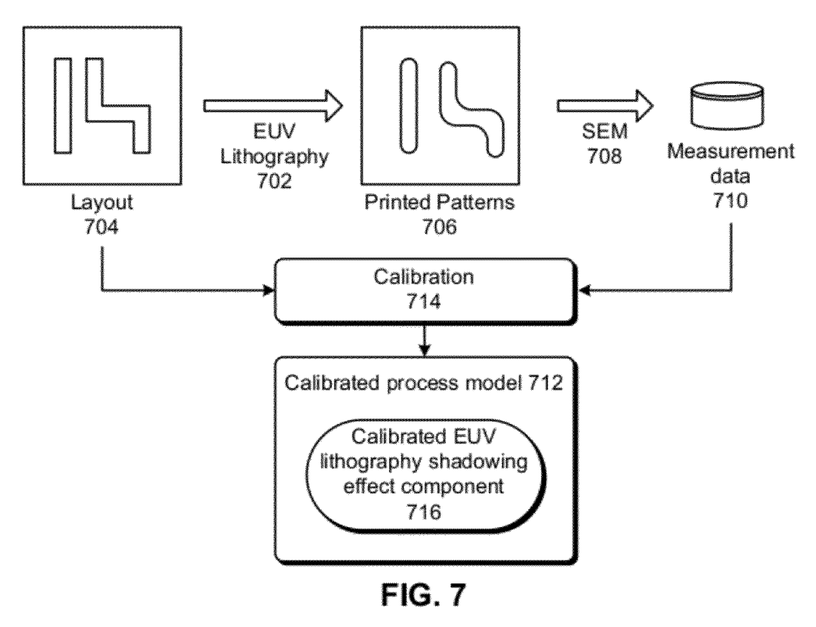
FIG. 7 illustrates how an EUV lithography shadowing effect component in a process model can be calibrated using empirical data in accordance with an embodiment of the present invention.

FIG. 7 illustrates how an EUV lithography shadowing effect component in a process model can be calibrated using empirical data in accordance with an embodiment of the present invention.

EUV lithography 702 can be used to print layout 704 on a wafer to obtain printed patterns 706. Next, a scanning electron microscope (SEM) 708 can be used to measure CDs and edge displacements in printed patterns 706 to obtain measurement data 710 (measurement data 710 is sometimes referred to as process data or empirical data).

During calibration 714, an uncalibrated process model that includes an uncalibrated EUV lithography shadowing effect component can be calibrated using layout 704 and measurement data 710 to obtain calibrated process model 712 that includes calibrated EUV lithography shadowing effect component 716. The uncalibrated EUV lithography shadowing effect component can correspond to expressions (5) and (6) with unknown parameter values. Calibrated EUV lithography shadowing effect component 716 can correspond to expressions (5) and (6) with fitted parameter values. In some embodiments, multiple components of the process model may be simultaneously calibrated during calibration 714.

Ideally, we may want to determine parameter values (e.g., $B_{max\_near}$, $B_{max\_far}$, and n in expressions (5) and (6)) which will cause the predicted data to exactly match the empirical data. However, an exact fit is usually not possible. Hence, statistical fitting techniques (e.g., least squares fitting) are typically used to determine the parameters so that the error between the empirical data and the predicted data is minimized.

Figure 8:
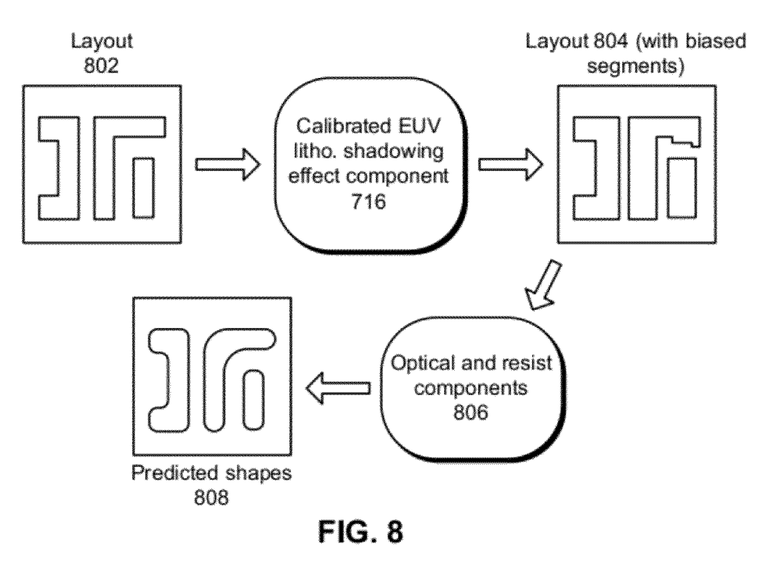
FIG. 8 illustrates how a process model can be used to predict shapes on the wafer in accordance with an embodiment of the present invention.

FIG. 8 illustrates how a process model can be used to predict shapes on the wafer in accordance with an embodiment of the present invention.

In some embodiments, the process model can include an EUV lithography shadowing effect component, an optical component, and a resist component. Calibrated EUV lithography shadowing effect component 716 can generate layout 804 by biasing segments in layout 802. Optical and resist components 806 can then receive layout 804 (with biased segments) as input and generate predicted shapes 808. A user can view predicted shapes 808 to determine whether the design intent in layout 802 is expected to be manufactured properly.

Figure 9:
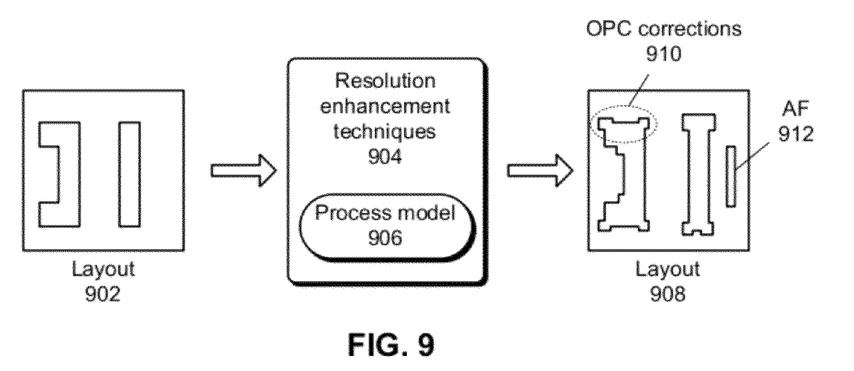
FIG. 9 illustrates how a process model can be used in RETs in accordance with an embodiment of the present invention.

FIG. 9 illustrates how a process model can be used in RETs in accordance with an embodiment of the present invention.

Process model 906 can include an EUV lithography shadowing effect component. RETs 904 can use process model 906 to modify layout 902 to obtain layout 908 (e.g., by performing OPC corrections 910 and/or by placing assist feature 912, etc.), which is expected to eliminate or substantially reduce manufacturing problems.

In some embodiments, a system can receive information about the placement (offset, rotation, mirroring, scaling, etc.) of a chip layout on a reticle, and mask scanning information (scanning axis direction, scanned area on the reticle, etc.). Next, the polygons in the chip layout can be dissected into a set of segments. A segment can be an entire edge of a polygon or a portion of an edge of a polygon. For each dissected segment, the system can determine the segment's position with respect to the ring slit, the segment's orientation, and determine whether the segment is on the near side or far side of the polygon.

Next, the system can plug-in the input values (e.g., angle value α which was determined based on the segment's position, orientation, etc.) into the EUV lithography shadowing effect component to determine a bias direction and a bias distance. The system can then bias the segment based on the bias direction and the bias distance. Next, the chip layout with the biased segments can be used to compute the aerial image intensity, which, in turn, can be used to predict the printed shapes (e.g., by comparing the aerial image intensity with a threshold). In this approach, the aerial image intensity already accounts for the EUV lithography shadowing effect. Therefore, downstream applications (e.g., optical proximity correction and verification applications) that use the aerial image intensity automatically account for the EUV lithography shadowing effects. In other words, the downstream applications do not require any additional changes to model the shadowing effect. For example, shadowing effect compensation is done automatically in the optical proximity correction process. There is no need to do a separate shadowing effect correction.

Figure 10:
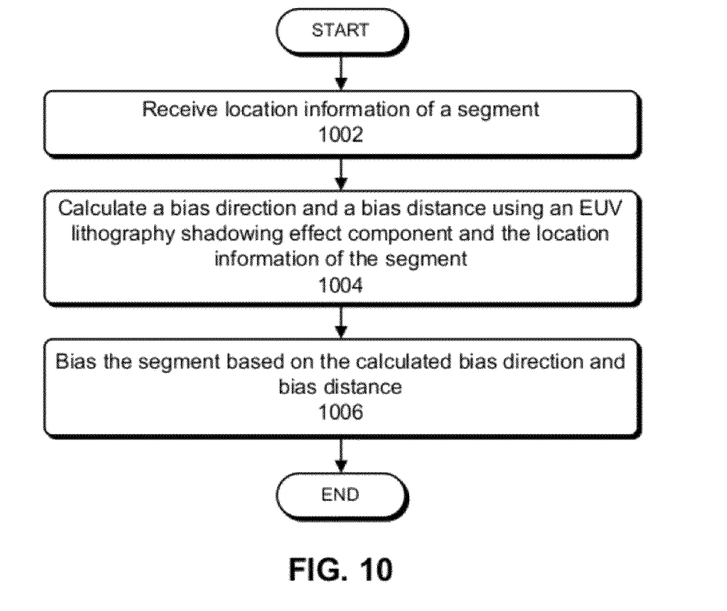
FIG. 10 presents a flowchart for determining a bias direction and a bias distance based on an EUV lithography shadowing effect component in accordance with some embodiments described herein.

FIG. 10 presents a flowchart for determining a bias direction and a bias distance based on an EUV lithography shadowing effect component in accordance with some embodiments described herein.

The process can begin with receiving location information of a segment (operation 1002). Next, a bias direction and a bias distance can be calculated using an EUV lithography shadowing effect component and the location information of the segment (operation 1004). For example, the value of angle α can be used to determine the bias direction, and to select either the near side expression (5) or the far side expression (6). Next, the selected expression can then be used to calculate the bias distance. The calculated bias direction and bias distance can then be used to bias the segment (operation 1006).

Figure 11:
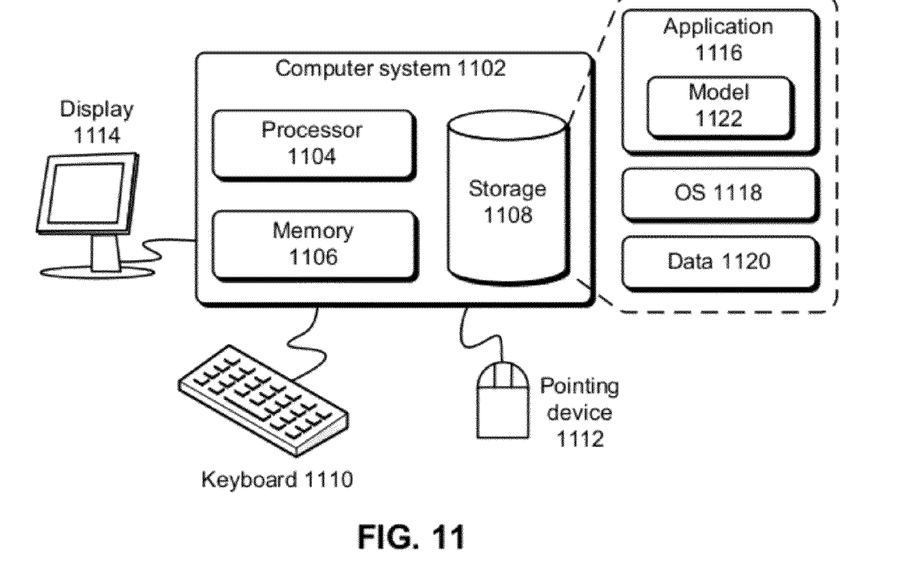
FIG. 11 illustrates a computer system in accordance with an embodiment of the present invention.

FIG. 11 illustrates a computer system in accordance with an embodiment of the present invention.

A computer system can generally be any system that can perform computations. Specifically, a computer system can be a microprocessor, an application specific integrated circuit, a distributed computing system, a cloud computing system, or any other computing system now known or later developed. Computer system 1102 comprises processor 1104, memory 1106, and storage 1108. Computer system 1102 can be coupled with display 1114, keyboard 1110, and pointing device 1112. Storage 1108 can generally be any device that can store data. Specifically, a storage device can be a magnetic, an optical, or a magneto-optical storage device, or it can be based on flash memory and/or battery-backed up memory. Storage 1108 can store application 1116, operating system 1118, and data 1120.

Application 1116 can include instructions that when executed by computer 1102 cause computer 1102 to perform one or more processes that are implicitly or explicitly described in this disclosure. Application 1116 can include model 1122 which can model, among other things, EUV lithography shadowing effects. Data 1120 can include measurement data, layout data, fitted parameter values, or any other data that is required by application 1116.

Figure 12:
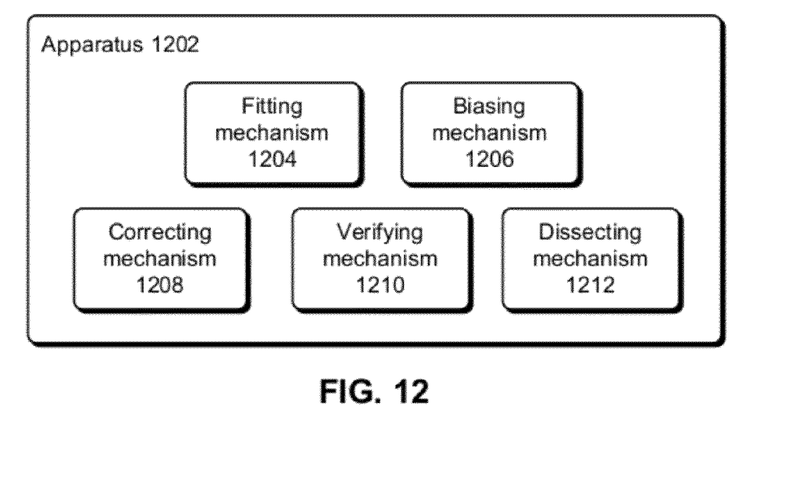
FIG. 12 illustrates an apparatus in accordance with an embodiment of the present invention.

FIG. 12 illustrates an apparatus in accordance with an embodiment of the present invention.

Apparatus 1202 can comprise a number of mechanisms which may communicate with one another via a wired or wireless communication channel. Apparatus 1202 may be realized using one or more integrated circuits, and it may be integrated in a computer system, or it may be realized as a separate device which is capable of communicating with other computer systems and/or devices. Apparatus 1202 can be capable of performing any process that is implicitly or explicitly described in this disclosure.

In some embodiments described herein, apparatus 1202 can comprise fitting mechanism 1204, biasing mechanism 1206, correcting mechanism 1208, verifying mechanism 1210, and dissecting mechanism 1212. Fitting mechanism 1204 may be configured to fit an uncalibrated process model (which may include an EUV lithography shadowing effect component) to empirical data. Dissecting mechanism 1212 may be configured to dissect polygon edges of a layout into segments. Biasing mechanism 1206 may be configured to bias segments of a layout using an EUV lithography shadowing effect component. Correcting mechanism 1208 may be configured to correct shapes (which may involve using an EUV lithography shadowing effect component) in a layout so that the printed patterns substantially match the design intent. Verifying mechanism 1210 may be configured to predict the patterns that will be printed by a mask layout, and to verify that the predicted patterns substantially match the design intent.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. A non-transitory computer-readable storage medium includes all computer-readable storage mediums with the sole exception of a propagating electromagnetic wave or signal. Specifically, a non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for modeling extreme ultraviolet (EUV) lithography shadowing effect, the method comprising:
   receiving location information of a segment in a layout;
   calculating a bias direction and a bias distance using an EUV lithography shadowing effect component and the location information of the segment, wherein the EUV lithography shadowing effect component includes multiple subcomponents, and wherein each subcomponent is applicable for a corresponding range of angles between a projection of an illumination ray on the mask plane and a normal of the segment; and
   biasing, by computer, the segment based on the calculated bias direction and bias distance.

2. The method of claim 1, wherein the method further comprises fitting parameters in the EUV lithography shadowing effect component to empirical data.

3. The method of claim 1, wherein the EUV lithography shadowing effect component models a shadowing effect that is dependent on one or more of:
   an angle between a projection of an illumination ray on the mask plane and a normal of the segment;
   a line size;
   a space size;

a pitch; or a pattern density.

4. The method of claim 1, wherein the EUV lithography shadowing effect component has multiple subcomponents, wherein each subcomponent is representable as $B=B_{max} \cdot \cos^n \alpha$, where B is the bias, $\alpha$ is an angle between a projection of an illumination ray on the mask plane and a normal of the segment, and $B_{max}$ and n are parameters that are fitted to empirical data.

5. The method of claim 1, wherein the method for modeling EUV lithography shadowing effect is performed during an optical proximity correction process.

6. The method of claim 1, wherein the method for modeling EUV lithography shadowing effect is performed during a lithography verification process.

7. The method of claim 1, wherein the method further comprises dissecting polygon edges in the layout into segments.

8. A non-transitory computer-readable storage medium storing instructions that, when executed by a computer, cause the computer to perform a method for modeling extreme ultraviolet (EUV) lithography shadowing effect, the method comprising:

receiving location information of a segment in a layout;

calculating a bias direction and a bias distance using an EUV lithography shadowing effect component and the location information of the segment, wherein the EUV lithography shadowing effect component includes multiple subcomponents, and wherein each subcomponent is applicable for a corresponding range of angles between a projection of an illumination ray on the mask plane and a normal of the segment; and biasing the segment based on the calculated bias direction and bias distance.

9. The non-transitory computer-readable storage medium of claim 8, wherein the method further comprises fitting parameters in the EUV lithography shadowing effect component to empirical data.

10. The non-transitory computer-readable storage medium of claim 8, wherein the EUV lithography shadowing effect component models a shadowing effect that is dependent on one or more of:

an angle between a projection of an illumination ray on the mask plane and a normal of the segment;

a line size;

a space size;

a pitch; or a pattern density.

11. The non-transitory computer-readable storage medium of claim 8, wherein the EUV lithography shadowing effect component has multiple subcomponents, wherein each subcomponent is representable as $B=B_{max} \cdot \cos^n \alpha$, where B is the bias, $\alpha$ is an angle between a projection of an illumination ray on the mask plane and a normal of the segment, and $B_{max}$ and n are parameters that are fitted to empirical data.

12. The non-transitory computer-readable storage medium of claim 8, wherein the method for modeling EUV lithography shadowing effect is performed during an optical proximity correction process.

13. The non-transitory computer-readable storage medium of claim 8, wherein the method for modeling EUV lithography shadowing effect is performed during a lithography verification process.

14. The non-transitory computer-readable storage medium of claim 8, wherein the method further comprises dissecting polygon edges in the layout into segments.

15. An apparatus for modeling extreme ultraviolet (EUV) lithography shadowing effect, the apparatus comprising:

a receiving mechanism configured to receive location information of a segment in a layout;

a calculating mechanism configured to calculate a bias direction and a bias distance using an EUV lithography shadowing effect component and the location information of the segment, wherein the EUV lithography shadowing effect component includes multiple subcomponents, and wherein each subcomponent is applicable for a corresponding range of angles between a projection of an illumination ray on the mask plane and a normal of the segment; and a biasing mechanism configured to bias the segment based on the calculated bias direction and bias distance.

16. The apparatus of claim 15, wherein the apparatus further comprises a fitting mechanism configured to fit parameters in the EUV lithography shadowing effect component to empirical data.

17. The apparatus of claim 15, wherein the EUV lithography shadowing effect component models a shadowing effect that is dependent on one or more of:

an angle between a projection of an illumination ray on the mask plane and a normal of the segment;

a line size;

a space size;

a pitch; or a pattern density.

18. The apparatus of claim 15, wherein the EUV lithography shadowing effect component has multiple subcomponents, wherein each subcomponent is representable as $B=B_{max} \cdot \cos^n \alpha$, where B is the bias, $\alpha$ is an angle between a projection of an illumination ray on the mask plane and a normal of the segment, and $B_{max}$ and n are parameters that are fitted to empirical data.

19. The apparatus of claim 15, further comprising a dissecting mechanism configured to dissect polygon edges in the layout into segments.

* * * * *